United States Patent
Mori et al.

(10) Patent No.: US 7,644,855 B2
(45) Date of Patent: Jan. 12, 2010

(54) BRAZING FILLER METAL, ASSEMBLY METHOD FOR SEMICONDUCTOR DEVICE USING SAME, AND SEMICONDUCTOR DEVICE

(75) Inventors: Nobuki Mori, Tokyo (JP); Kei Morimoto, Tokyo (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 0 days.

(21) Appl. No.: 11/068,527

(22) Filed: Feb. 28, 2005

(65) Prior Publication Data

US 2005/0173498 A1 Aug. 11, 2005

Related U.S. Application Data

(63) Continuation of application No. PCT/JP03/011730, filed on Sep. 12, 2003.

(30) Foreign Application Priority Data

Sep. 19, 2002 (JP) .............................. 2002-273598

(51) Int. Cl.
*B23K 31/02* (2006.01)
(52) U.S. Cl. ..................... 228/246; 228/262.9; 420/557; 420/559; 148/24
(58) Field of Classification Search ................. 228/246, 228/262.9; 420/557, 571, 559, 560; 428/647; 148/24
See application file for complete search history.

(56) References Cited

U.S. PATENT DOCUMENTS

| | | | | |
|---|---|---|---|---|
| 4,734,256 A | * | 3/1988 | Liebermann et al. | 420/571 |
| 4,758,407 A | * | 7/1988 | Ballentine et al. | 420/560 |
| 5,102,748 A | * | 4/1992 | Wylam et al. | 428/647 |
| 5,299,726 A | * | 4/1994 | Sauer | 228/111.5 |
| 5,487,868 A | * | 1/1996 | Nishimura | 420/559 |
| 5,851,482 A | * | 12/1998 | Kim | 420/557 |
| 6,033,488 A | * | 3/2000 | An et al. | 148/24 |

FOREIGN PATENT DOCUMENTS

| | | |
|---|---|---|
| JP | 6-244226 | 9/1994 |
| JP | 3033378 | 2/2000 |
| JP | 2001-144111 | 5/2001 |
| JP | 2001-196393 | 7/2001 |
| JP | 2001-284792 | 10/2001 |

OTHER PUBLICATIONS

Translation of JP 48-067133, Katsue et al., Sep. 1973.*

* cited by examiner

*Primary Examiner*—Jessica L. Ward
*Assistant Examiner*—Michael Aboagye
(74) *Attorney, Agent, or Firm*—Katten Muchin Rosenman LLP

(57) ABSTRACT

In conventional Sn/Sb type brazing filler metals, there are disadvantages that large grains in a β' phase are likely to deposit and that cracks are likely to occur in the elements and the bonded portion, and that voids are formed when the above described special coating is provided on the die bonding plane of the semiconductor element. The brazing filler metal of the present invention comprises 5 to 20 weight % of Sb and 0.01 to 5 weight % of Te, with the balance being Sn and incidental impurities, or a brazing filler metal comprises 5 to 20 weight % of Sb, 0.01 to 5 weight % of Te, 0.001 to 0.5 weight % of P, with the balance being Sn and incidental impurities.

12 Claims, No Drawings

BRAZING FILLER METAL, ASSEMBLY METHOD FOR SEMICONDUCTOR DEVICE USING SAME, AND SEMICONDUCTOR DEVICE

CROSS-REFERENCE TO RELATED APPLICATION

This application is a continuation of International Application PCT/JP03/11730 which was filed on Sep. 12, 2003, and claims priority from Japanese Patent Application 2002-273598 filed in Sep. 19, 2002, the contents of which are herein wholly incorporated by reference.

TECHNICAL FIELD

The present invention relates to a high-temperature brazing filler metal, used for die bonding of semiconductor elements and assembly of electronic parts, and more specifically, relates to a high-temperature brazing filler metal that does not contain Pb.

BACKGROUND ART

When high-frequency elements or semiconductor elements are die-bonded to a lead frame or the like to assemble a semiconductor device or electronic parts, Au-type brazing filler metals represented by Au/20 weight % Sn (20 weight % of Sn, and the remainder is Au), or a Pb-type brazing filler metal represented by Pb/5 weight % Sn (5 weight % of Sn, and the remainder is Pb), having a melting point of about 300° C., are used.

The reason why these brazing filler metals having a melting point of about 300° C. are used for die bonding is to prevent the brazing filler metal used at the time of die bonding from remelting to cause performance deterioration, when the assembled semiconductor device is mounted on a printed board under conditions of a temperature of from 240 to 260° C. and a heating period of 10 seconds or less. Moreover, in the assembly of electronic parts, these brazing filler metals are used so that the brazing filler metal used in a previous step does not remelt at the time of step brazing (at 220 to 260° C.) carried out in a subsequent step.

However, the Au-type brazing filler metal has a problem of being expensive, and the Pb-type brazing filler metal has a problem of environmental pollution. Hence, there is a demand for a brazing filler metal that does not contain Pb, is economical and capable of brazing at 300 to 340° C., with a melting temperature thereof being 260° C. or higher, and has excellent wettability.

In order to respond to such a demand, there has been proposed a soldering material containing at least one kind of Fe and Ni in an amount of from 0.005 to 5.0 weight %, and preferably, 0.1 to 20 weight % of Ag, or 0.05 to 9 weight % of Cu, or 0.1 to 15 weight % of Ag, and 0.05 to 5 weight % of Cu, and further containing 0.1 to 15 weight % of Sb, with the remainder being Sn substantially (see Japanese Patent Publication No. Tokukai 2001-144111).

Moreover, there is another proposal for a soldering material for die bonding, which contains 11.0 to 20.0 weight % of Sb, 0.01 to 0.2 weight % of P, and preferably, 0.005 to 5.0 weight % of at least one kind of Cu and Ni, with the balance being Sn and incidental impurities (see Japanese Patent Publication No. Tokukai 2001-284792).

These are proposed for resolving the disadvantage of Sn/Sb type solder having poor performance against thermal fatigue, and reducing a resistance change in a die-bonded portion which is placed at a high temperature when the semiconductor device is mounted by soldering on a printed board.

Incidentally, a multi-level metal layer such as Cr—Ni—Ag or Ti—Cu—Ag is provided on a bonding plane of the semiconductor element and the solder (hereinafter referred to as a "die bonding plane of a semiconductor element"), for improving the wettability with the solder. When an Sn/Sb type solder is used as the die bonding solder, Ag on the outermost surface of the multi-metal layer fuses with the soldering material to decrease the melting point of the soldering material excessively (see Paragraph No. 0006 in Japanese Patent Publication No. Tokukai 2001-196393). In order to solve this problem, there is proposed a method in which a first metallic coating and a second metallic coating are formed in this order on the die bonding plane of the semiconductor device, the second metallic coating is a coating containing tin or antimony, and an Sn/Sb type solder is used as a solder (see Paragraph No. 0008 in Japanese Patent Publication No. Tokukai 2001-196393).

Especially, when the heat output of the semiconductor element is large, an Sn-5 weight % Sb type solder is used in order to obtain high reliability. However, at this time there is a problem in that an intermediate metal layer such as Ni and Cu in the multi-metal layer reacts with the solder due to the heat at the time of operating the semiconductor device or application of stress, to form a hard and brittle intermetallic compound layer, and fracture progresses from this layer (see Paragraph Nos. 0005 to 0006, in Japanese Patent No. 3033378). In order to solve this problem there is described usage of an Sn/Sb type solder, by forming the outermost layer of the die bonding plane of the semiconductor element of Cr, Ti, Mo, W, Zr and Hf, or providing a surface metal layer comprising at least one kind of metal selected from the group consisting of Sn, Sb, Au, Ag, Pt, Ni, Cu, Zn, Al, Co, Fe and Pb on the metal layer (see Paragraph Nos. 0010 to 0011, in Japanese Patent No. 3033378).

According to the above described two methods, an excessive drop in the melting point of the solder can be prevented, or generation of a hard and brittle intermetallic compound layer can be prevented. However, it has been found that a new problem occurs in that a lot of voids are generated on the semiconductor element side in the solder layer after the die bonding. The presence of voids deteriorates the long-term reliability.

In the Sn/Sb type brazing filler metal heretofore provided, there are disadvantages that large grains in a β' phase are likely to deposit and that cracks are likely to occur in the elements and the bonded portion, and moreover that voids are formed when the above described special coating is provided on the die bonding plane of the semiconductor element, and such disadvantages have not yet been overcome. Hence, it cannot be said that the Sn/Sb type brazing filler metal is adequate.

In view of the above situation, it is an object of the present invention to provide a novel Sn/Sb type brazing filler metal which does not contain Pb and is suitable for being used in die-bonding semiconductor elements or assembling electronic parts.

DISCLOSURE OF THE INVENTION

According to a first aspect of the invention for solving the problems, a brazing filler metal comprise 5 to 20 weight % of Sb and 0.01 to 5 weight % of Te, with the balance being Sn and incidental impurities. Moreover, in order to improve the thermal cyclicity of the brazing filler metal, at least one member of Ag, Cu, Fe and Ni may be added in a total amount of from 0.01 to 5 weight % to the brazing filler metal.

Accoding to a second aspect of the invention, a brazing filler metal comprise 5 to 20 weight % of Sb, 0.01 to 5 weight % of Te, and 0.001 to 0.5 weight % of P, with the balance being Sn and incidental impurities. Moreover, in order to improve the thermal cyclicity of the brazing filler metal, at least one member of Ag, Cu, Fe and Ni may be added in a total amount of from 0.01 to 5 weight % to the brazing filler metal.

According to a third aspect of the invention, an assembly method for semiconductor devices is provided in which semiconductor elements are die-bonded by using a brazing filler metal to assemble a semiconductor device, wherein a brazing filler metal according to the first or second aspects of the invention is used as the brazing filler metal.

According to a fourth aspect of the invention, a semiconductor device is assembled by using the brazing filler metal according to the first or second aspects of the invention.

BEST MODE FOR CARRYING OUT THE INVENTION

According to a first aspect of the invention for solving the problems, a brazing filler metal comprises 5 to 20 weight % of Sb and 0.01 to 5 weight % of Te, with the balance being Sn and incidental impurities. Te is added for refining the generated β' phase to prevent the occurrence of a crack. The reason why the concentration of Te is set to 0.01 to 5 weight % is that if the concentration thereof is less than 0.01 weight %, a sufficient effect of refining the β' phase cannot be obtained, and if the concentration thereof exceeds 5 weight %, further effect of refining the β' phase cannot be expected, and only the cost increases.

The reason why the concentration of Sb is set to 5 to 20 weight % is that if the concentration thereof is less than 5 weight %, the liquid phase temperature becomes lower than 240° C., and the brazing filler metal cannot endure the processing temperature at 260° C. used in the subsequent step after die bonding. If the concentration thereof exceeds 20 weight %, the liquid phase temperature exceeds 320° C., and die bonding at 340° C. becomes insufficient. If at least one member of Ag, Cu, Fe and Ni is added in a total amount of from 0.01 to 5 weight % to the brazing filler metal and dispersed, the thermal cyclicity of the brazing filler metal is further improved.

According to a second aspect of the invention, a brazing filler metal comprise 5 to 20 weight % of Sb, 0.01 to 5 weight % of Te, and 0.001 to 0.5 weight % of P, with the balance being Sn and incidental impurities. The reason for the addition range of Sb and Te is the same as in the first aspect of the invention. P is added for further improving the wettability, so that voids are not likely to occur between the semiconductor elements and the brazing filler metal at the time of die bonding. If the concentration of P is less than 0.001 weight %, this effect cannot be obtained, and if P is added exceeding 0.5 weight %, casting at a low cost becomes difficult.

As a reason why the occurrence of voids is suppressed by adding P, the present inventor presumes that when the brazing filler metal melts, oxygen preferentially reacts with P, to prevent an oxide film from being formed on the surface of the melting body, thereby improving the wettability. As in the brazing filler metal of the first aspect of the invention, if at least one kind of Ag, Cu, Fe and Ni is added in a total amount of from 0.01 to 5 weight % to the brazing filler metal and dispersed, the thermal cyclicity of the brazing filler metal is further improved.

At the time of using the brazing filler metal of the first and second aspects of the invention, the conventional steps and conditions can be used without any change. Semiconductor devices manufactured by using the brazing filler metal of the present invention have the same reliability as or better reliability than that of the semiconductor devices manufactured by using a conventional brazing filler metal made of a gold base alloy or a brazing filler metal made of a lead base alloy.

The present invention will be described in more detail by way of examples.

EXAMPLES 1 TO 20

Sn, Sb and Te respectively having a purity of 99.9% were used to obtain ingots of Sn alloy having compositions shown in Table 1, by an atmospheric melting furnace. The ingots were then subjected to extruding to a diameter of 1 mm to prepare samples in a wire form.

For evaluating the wettability of the obtained alloy, the wire was pressed against a copper plate in a nitrogen gas stream at 340° C., and after having melted, the wire was slowly cooled in a nitrogen atmosphere. The slow cooling was conducted for evaluating the wettability under a severer condition in which the β' phase becomes coarser.

A section of the portion pressed against the copper plate and slowly cooled was ground and polished, to observe the size of the formed β' phase. As a result, the size of the β' phase was all not larger than 20 μm. This can be judged as an effect of adding Te.

For evaluating the bonding reliability, a dummy chip prepared by depositing Au on a silicon die bonding plane, was die-bonded on a copper lead frame by using the sample having a diameter of 1 mm and a die bonder. The dummy chip was then molded by using an epoxy resin. The molded articles were used to conduct temperature cycle tests at a temperature of from −50° C. to 150° C. for 500 cycles. Thereafter, the resin was opened, and the bonded portion was observed. It was evaluated as "good", when there was no crack in the chip or the bonded portion, or as "poor" when a crack occurred. The results are shown in Table 1.

A part of the molded article was mounted on a mount board, to examine if there was any abnormality in the mounted chip or in the bonded portion, and if there was a void in the brazing filler metal. As a result, any abnormality was not found in all samples, and any void was not confirmed.

TABLE 1

| | Composition (wt. %) | | | |
| --- | --- | --- | --- | --- |
| | Sn | Sb | Te | Bonding Reliability |
| Example 1 | balance | 5 | 0.05 | good |
| Example 2 | balance | 5 | 0.1 | good |
| Example 3 | balance | 5 | 0.5 | good |
| Example 4 | balance | 5 | 2.0 | good |
| Example 5 | balance | 5 | 5.0 | good |
| Example 6 | balance | 8 | 0.05 | good |
| Example 7 | balance | 8 | 0.1 | good |
| Example 8 | balance | 8 | 0.5 | good |
| Example 9 | balance | 8 | 2.0 | good |
| Example 10 | balance | 8 | 5.0 | good |
| Example 11 | balance | 12 | 0.05 | good |
| Example 12 | balance | 12 | 0.1 | good |
| Example 13 | balance | 12 | 0.5 | good |
| Example 14 | balance | 12 | 2.0 | good |
| Example 15 | balance | 12 | 5.0 | good |
| Example 16 | balance | 20 | 0.05 | good |
| Example 17 | balance | 20 | 0.1 | good |
| Example 18 | balance | 20 | 0.5 | good |
| Example 19 | balance | 20 | 2.0 | good |
| Example 20 | balance | 20 | 5.0 | good |

From Table 1, it is seen that the Sn alloy according to the present invention has no problem in the bonding reliability.

EXAMPLES 21 TO 80

Raw materials of Sn, Sb, Te and P respectively having a purity of 99.9% were used to obtain ingots of Sn alloy having compositions shown in Tables 2 to 5, by an atmospheric melting furnace. The ingots were then subjected to extruding to a diameter of 1 mm to prepare samples in a wire form.

For evaluating the wettability of the obtained alloy, the wire was pressed against a copper plate in a nitrogen gas stream at 340° C., and after having melted, the wire was slowly cooled in a nitrogen atmosphere. The slow cooling was conducted for evaluating the wettability under a severer condition in which the β' phase becomes coarser.

A section of the portion pressed against the copper plate and slowly cooled was ground and polished, to observe the size of the formed β' phase. As a result, the size of the β' phase was all not larger than 20 μm, as in Examples 1 to 20. This can be judged as an effect of adding Te.

For evaluating the bonding reliability, a dummy chip prepared by depositing Au on a silicon die bonding plane, was die-bonded on a copper lead frame by using the sample having a diameter of 1 mm and a die bonder. The dummy chip was then molded by using an epoxy resin. The molded articles were used to conduct temperature cycle tests at a temperature of from −50° C. to 150° C. for 500 cycles. Thereafter, the resin was opened, and the bonded portion was observed. It was evaluated as "good", when there was no crack in the chip or the bonded portion, or as "poor" when a crack occurred. The results are shown in Tables 2 to 5.

A part of the molded article was mounted on a mount board, to examine if there was any abnormality in the mounted chip or in the bonded portion, and if there was a void in the brazing filler metal. As a result, any abnormality was not found in all samples, and any void was not confirmed.

TABLE 2

| | Composition (wt. %) | | | | Bonding Reliability |
|---|---|---|---|---|---|
| | Sn | Sb | Te | P | |
| Example 21 | balance | 5 | 0.1 | 0.005 | good |
| Example 22 | balance | 5 | 0.1 | 0.05 | good |
| Example 23 | balance | 5 | 0.1 | 0.1 | good |
| Example 24 | balance | 5 | 0.1 | 0.3 | good |
| Example 25 | balance | 5 | 0.1 | 0.5 | good |
| Example 26 | balance | 5 | 2.0 | 0.005 | good |
| Example 27 | balance | 5 | 2.0 | 0.05 | good |
| Example 28 | balance | 5 | 2.0 | 0.1 | good |
| Example 29 | balance | 5 | 2.0 | 0.3 | good |
| Example 30 | balance | 5 | 2.0 | 0.5 | good |
| Example 31 | balance | 5 | 5.0 | 0.005 | good |
| Example 32 | balance | 5 | 5.0 | 0.05 | good |
| Example 33 | balance | 5 | 5.0 | 0.1 | good |
| Example 34 | balance | 5 | 5.0 | 0.3 | good |
| Example 35 | balance | 5 | 5.0 | 0.5 | good |

TABLE 3

| | Composition (wt. %) | | | | Bonding Reliability |
|---|---|---|---|---|---|
| | Sn | Sb | Te | P | |
| Example 36 | balance | 8 | 0.1 | 0.005 | good |
| Example 37 | balance | 8 | 0.1 | 0.05 | good |
| Example 38 | balance | 8 | 0.1 | 0.1 | good |
| Example 39 | balance | 8 | 0.1 | 0.3 | good |
| Example 40 | balance | 8 | 0.1 | 0.5 | good |
| Example 41 | balance | 8 | 2.0 | 0.005 | good |
| Example 42 | balance | 8 | 2.0 | 0.05 | good |
| Example 43 | balance | 8 | 2.0 | 0.1 | good |
| Example 44 | balance | 8 | 2.0 | 0.3 | good |
| Example 45 | balance | 8 | 2.0 | 0.5 | good |
| Example 46 | balance | 8 | 5.0 | 0.005 | good |
| Example 47 | balance | 8 | 5.0 | 0.05 | good |
| Example 48 | balance | 8 | 5.0 | 0.1 | good |
| Example 49 | balance | 8 | 5.0 | 0.3 | good |
| Example 50 | balance | 8 | 5.0 | 0.5 | good |

TABLE 4

| | Composition (wt. %) | | | | Bonding Reliability |
|---|---|---|---|---|---|
| | Sn | Sb | Te | P | |
| Example 51 | balance | 12 | 0.1 | 0.005 | good |
| Example 52 | balance | 12 | 0.1 | 0.05 | good |
| Example 53 | balance | 12 | 0.1 | 0.1 | good |
| Example 54 | balance | 12 | 0.1 | 0.3 | good |
| Example 55 | balance | 12 | 0.1 | 0.5 | good |
| Example 56 | balance | 12 | 2.0 | 0.005 | good |
| Example 57 | balance | 12 | 2.0 | 0.05 | good |
| Example 58 | balance | 12 | 2.0 | 0.1 | good |
| Example 59 | balance | 12 | 2.0 | 0.3 | good |
| Example 60 | balance | 12 | 2.0 | 0.5 | good |
| Example 61 | balance | 12 | 5.0 | 0.005 | good |
| Example 62 | balance | 12 | 5.0 | 0.05 | good |
| Example 63 | balance | 12 | 5.0 | 0.1 | good |
| Example 64 | balance | 12 | 5.0 | 0.3 | good |
| Example 65 | balance | 12 | 5.0 | 0.5 | good |

TABLE 5

| | Composition (wt. %) | | | | Bonding Reliability |
|---|---|---|---|---|---|
| | Sn | Sb | Te | P | |
| Example 66 | balance | 20 | 0.1 | 0.005 | good |
| Example 67 | balance | 20 | 0.1 | 0.05 | good |
| Example 68 | balance | 20 | 0.1 | 0.1 | good |
| Example 69 | balance | 20 | 0.1 | 0.3 | good |
| Example 70 | balance | 20 | 0.1 | 0.5 | good |
| Example 71 | balance | 20 | 2.0 | 0.005 | good |
| Example 72 | balance | 20 | 2.0 | 0.05 | good |
| Example 73 | balance | 20 | 2.0 | 0.1 | good |
| Example 74 | balance | 20 | 2.0 | 0.3 | good |
| Example 75 | balance | 20 | 2.0 | 0.5 | good |
| Example 76 | balance | 20 | 5.0 | 0.005 | good |
| Example 77 | balance | 20 | 5.0 | 0.05 | good |
| Example 78 | balance | 20 | 5.0 | 0.1 | good |
| Example 79 | balance | 20 | 5.0 | 0.3 | good |
| Example 80 | balance | 20 | 5.0 | 0.5 | good |

From Tables 2 to 5, it is seen that the Sn alloy according to the present invention has no problem in the bonding reliability.

EXAMPLES 81 TO 100

Raw materials of Sn, Sb, Te, P, Ag, Cu, Fe and Ni respectively having a purity of 99.9% were used to obtain ingots of Sn alloy having compositions shown in Table 6, by an atmospheric melting furnace. The ingots were then subjected to extruding to a diameter of 1 mm to prepare samples in a wire form.

For evaluating the wettability of the obtained alloy, the wire was pressed against a copper plate in a nitrogen gas stream at 340° C., and after having melted, the wire was slowly cooled in a nitrogen atmosphere. The slow cooling was conducted for evaluating the wettability under a severer condition in which the β' phase becomes coarser.

A section of the portion pressed against the copper plate and slowly cooled was ground and polished, to observe the size of the formed β' phase. As a result, the size of the β' phase was all not larger than 20 μm, as in Examples 1 to 20. This can be judged as an effect of adding Te.

For evaluating the bonding reliability, a dummy chip with a metal film prepared by depositing Ni and Sb in this order on a silicon die bonding plane, was die-bonded on a copper lead frame by using the sample having a diameter of 1 mm and a die bonder. The dummy chip was then molded by using an epoxy resin. The molded articles were used to conduct temperature cycle tests at a temperature of from −50° C. to 150° C. for 500 cycles. Thereafter, the resin was opened, and the bonded portion was observed. It was evaluated as "good", when there was no crack in the chip or the bonded portion, or as "poor" when a crack occurred. The results are shown in Table 6.

A part of the molded article was mounted on a mount board, to examine if there was any abnormality in the mounted chip or in the bonded portion, and if there was a void in the brazing filler metal. As a result, any abnormality was not found in all samples, and any void was not confirmed.

TABLE 6

| | Composition (wt. %) | | | | | | | Bonding Reliability |
|---|---|---|---|---|---|---|---|---|
| | Sn | Sb | Te | P | Ag | Cu | Fe | Ni | |
| Ex-81 | balance | 8 | 0.5 | 0.0 | 0.5 | — | — | — | good |
| Ex-82 | balance | 8 | 0.5 | 0.0 | — | 0.5 | — | — | good |
| Ex-83 | balance | 8 | 0.5 | 0.0 | — | — | 0.5 | — | good |
| Ex-84 | balance | 8 | 0.5 | 0.0 | — | — | — | 0.5 | good |
| Ex-85 | balance | 8 | 0.5 | 0.0 | 0.5 | 0.5 | 0.5 | 0.5 | good |
| Ex-86 | balance | 12 | 0.5 | 0.0 | 0.5 | — | — | — | good |
| Ex-87 | balance | 12 | 0.5 | 0.0 | — | 0.5 | — | — | good |
| Ex-88 | balance | 12 | 0.5 | 0.0 | — | — | 0.5 | — | good |
| Ex-89 | balance | 12 | 0.5 | 0.0 | — | — | — | 0.5 | good |
| Ex-90 | balance | 12 | 0.5 | 0.0 | 0.5 | 0.5 | 0.5 | 0.5 | good |
| Ex-91 | balance | 8 | 0.5 | 0.1 | 0.5 | — | — | — | good |
| Ex-92 | balance | 8 | 0.5 | 0.1 | — | 0.5 | — | — | good |
| Ex-93 | balance | 8 | 0.5 | 0.1 | — | — | 0.5 | — | good |
| Ex-94 | balance | 8 | 0.5 | 0.1 | — | — | — | 0.5 | good |
| Ex-95 | balance | 8 | 0.5 | 0.1 | 0.5 | 0.5 | 0.5 | 0.5 | good |
| Ex-96 | balance | 12 | 0.5 | 0.1 | 0.5 | — | — | — | good |
| Ex-97 | balance | 12 | 0.5 | 0.1 | — | 0.5 | — | — | good |
| Ex-98 | balance | 12 | 0.5 | 0.1 | — | — | 0.5 | — | good |
| Ex-99 | balance | 12 | 0.5 | 0.1 | — | — | — | 0.5 | good |
| Ex-100 | balance | 12 | 0.5 | 0.1 | 0.5 | 0.5 | 0.5 | 0.5 | good |

(Ex = Example)

From Table 6, it is seen that the Sn alloy according to the present invention has no problem in the bonding reliability.

COMPARATIVE EXAMPLES 1 TO 20

Raw materials of Sn, Sb, Te and P respectively having a purity of 99.9% were used to obtain ingots of Sn alloy having compositions shown in Tables 7 and 8, by an atmospheric melting furnace. The ingots were then subjected to extruding to a diameter of 1 mm to prepare samples in a wire form.

For evaluating the wettability of the obtained alloy, the wire was pressed against a copper plate in a nitrogen gas stream at 340° C., and after having melted, the wire was slowly cooled in a nitrogen atmosphere. The slow cooling was conducted for evaluating the wettability under a severer condition in which the β' phase becomes coarser.

A section of the portion pressed against the copper plate and slowly cooled was ground and polished, to observe the size of the formed β' phase. As a result, the size of the β' phase was all about 100 μm.

For evaluating the bonding reliability, a dummy chip prepared by depositing Au on a silicon die bonding plane, was die-bonded on a copper lead frame by using the sample having a diameter of 1 mm and a die bonder. The dummy chip was then molded by using an epoxy resin. The molded articles were used to conduct temperature cycle tests at a temperature of from −50° C. to 150° C. for 500 cycles. Thereafter, the resin was opened, and the bonded portion was observed. It was evaluated as "good", when there was no crack in the chip or the bonded portion, or as "poor" when a crack occurred. The results are shown in Tables 7 and 8.

TABLE 7

| | Composition (wt. %) | | | Bonding Reliability |
|---|---|---|---|---|
| | Sn | Sb | Te | |
| C-Example 1 | balance | 5 | 0.0 | poor |
| C-Example 2 | balance | 5 | 6.0 | poor |
| C-Example 3 | balance | 8 | 0.0 | poor |
| C-Example 4 | balance | 8 | 6.0 | poor |
| C-Example 5 | balance | 12 | 0.0 | poor |
| C-Example 6 | balance | 12 | 6.0 | poor |
| C-Example 7 | balance | 20 | 0.0 | poor |
| C-Example 8 | balance | 20 | 6.0 | poor |
| C-Example 9 | balance | 3 | 0.5 | poor |
| C-Example 10 | balance | 25 | 0.5 | poor |

(C = Comparative)

TABLE 8

| | Composition (wt. %) | | | | Bonding Reliability |
|---|---|---|---|---|---|
| | Sn | Sb | Te | P | |
| C-Example 11 | balance | 5 | 0.0 | 0.1 | poor |
| C-Example 12 | balance | 5 | 6.0 | 0.3 | poor |
| C-Example 13 | balance | 8 | 0.0 | 0.1 | poor |
| C-Example 14 | balance | 8 | 6.0 | 0.3 | poor |
| C-Example 15 | balance | 12 | 0.0 | 0.1 | poor |
| C-Example 16 | balance | 12 | 6.0 | 0.3 | poor |
| C-Example 17 | balance | 20 | 0.0 | 0.1 | poor |
| C-Example 18 | balance | 20 | 6.0 | 0.3 | poor |
| C-Example 19 | balance | 3 | 0.5 | 0.3 | poor |
| C-Example 20 | balance | 25 | 0.5 | 0.3 | poor |

(C = Comparative)

From Tables 7 and 8, the usefulness of the Sn alloy of the present invention can be substantiated.

As described above, the brazing filler metal of the first aspect of the invention comprises 5 to 20 weight % of Sb and 0.01 to 5 weight % of Te, with the balance being Sn and incidental impurities. As a result, the β' phase generated at the time of die bonding can be refined, thereby preventing occurrence of cracks. Moreover, if at least one member of Ag, Cu, Fe and Ni is added in a total amount of from 0.01 to 5 weight % and dispersed in the brazing filler metal, the thermal cyclicity of the brazing filler metal can be further improved.

The brazing filler metal of the second aspect of the invention comprises 5 to 20 weight % of Sb, 0.01 to 5 weight % of Te, and 0.001 to 0.5 weight % of P, with the balance being Sn and incidental impurities. As a result, the wettability is improved, and at the time of die bonding, voids are not likely to occur between the semiconductor elements and the brazing filler metal. If at least one member of Ag, Cu, Fe and Ni is added in a total amount of from 0.01 to 5 weight % and dispersed in the brazing filler metal, the thermal cyclicity of the brazing filler metal can be further improved.

According to the third aspect of the invention, an assembly method for semiconductor devices using the brazing filler metal according to the first or second aspects of the invention. By using the brazing filler metal of the present invention, highly reliable semiconductor devices can be obtained at a low cost.

According to the fourth aspect of the invention, a semiconductor device assembled is provided by using the brazing filler metal according to the first or second aspects of the invention. The semiconductor device becomes economical and highly reliable by using the brazing filler metal of the present invention.

The invention claimed is:

1. A lead-free brazing filler metal consisting of 5 to 20 weight % of Sb, 0.01 to 5 weight % of Te, and 0.001 to 0.5 weight % of P, with the balance being Sn and inevitable impurities.

2. The lead-free brazing filler metal of claim 1, wherein a melting point is at least 300° C.

3. The lead-free brazing filler metal of claim 1, wherein Sb is present in the range of 12 to 20 weight % of Sb.

4. A lead-free brazing filler metal consisting of 5 to 20 weight % of Sb, 0.01 to 5 weight % of Te, 0.001 to 0.5 weight % of P, and a total amount of from 0.01 to 5 weight % of at least one of Ag, Cu, Fe, and Ni, with the balance being Sn and inevitable impurities.

5. The lead-free brazing filler metal of claim 4, wherein a melting point is at least 300° C.

6. The lead-free brazing filler metal of claim 4, wherein Sb is present in the range of 12 to 20 weight % of Sb.

7. An assembly method for a semiconductor device, the method comprising the steps of:
    die-bonding a semiconductor element by using a brazing filler metal,
    wherein the brazing filler metal consists of 5 to 20 weight % of Sb, 0.01 to 5 weight % of Te, and 0.001 to 0.5 weight % of P, with the balance being Sn and inevitable impurities.

8. The assembly method of claim 7, wherein a melting point is at least 300° C.

9. The assembly method of claim 7, wherein Sb is present in the range of 12 to 20 weight % of Sb.

10. A semiconductor device comprising:
    a brazing filler metal, wherein the brazing filler metal consists of 5 to 20 weight % of Sb, 0.01 to 5 weight % of Te, and 0.001 to 0.5 weight % of P, with the balance being Sn and inevitable impurities.

11. The semiconductor device of claim 10, wherein the lead-free brazing filler metal comprises a melting point of at least 300° C.

12. The semiconductor device of claim 10, wherein Sb is present in the range of 12 to 20 weight % of Sb.

* * * * *